(12) United States Patent
McColloch

(10) Patent No.: US 8,488,334 B2
(45) Date of Patent: Jul. 16, 2013

(54) ELECTROMAGNETIC INTERFERENCE (EMI) ABSORBING ASSEMBLY AND METHOD FOR USE IN AN OPTICAL TRANSCEIVER MODULE

(75) Inventor: Laurence R. McColloch, Santa Clara, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1557 days.

(21) Appl. No.: 12/028,863

(22) Filed: Feb. 11, 2008

(65) Prior Publication Data
US 2012/0155054 A1   Jun. 21, 2012

(51) Int. Cl.
*H05K 9/00* (2006.01)

(52) U.S. Cl.
USPC ............... 361/818; 361/816; 361/799

(58) Field of Classification Search
USPC ............ 361/800, 816, 818, 799, 600
See application file for complete search history.

(56) References Cited

U.S. PATENT DOCUMENTS

| | | | |
|---|---|---|---|
| 6,410,847 B1* | 6/2002 | Allen et al. | 174/390 |
| 6,632,027 B1* | 10/2003 | Yoshida et al. | 385/88 |
| 6,860,649 B2* | 3/2005 | Edwards et al. | 385/92 |
| 7,195,404 B1* | 3/2007 | Dudley | 385/92 |
| 7,262,369 B1* | 8/2007 | English | 174/370 |
| 7,534,052 B2* | 5/2009 | Fujiwara et al. | 385/88 |
| 8,077,479 B2* | 12/2011 | Ligtenberg | 361/816 |
| 2005/0135758 A1* | 6/2005 | Sato et al. | 385/92 |

* cited by examiner

*Primary Examiner* — Hung S Bui

(57) ABSTRACT

An optical transceiver module is provided that has an EMI absorbing assembly that comprises an EMI absorbing device that is electrically grounded rather than standing in free space in the transceiver module so that the assembly absorbs both the magnetic and electrical components of the EMI. In accordance with an embodiment, the EMI absorbing assembly includes a leadframe about which an EMI absorbing material is cast. The leadframe preferably is shaped in a way that prevents or lessens the occurrence of resonant EMI modes in the transceiver module housing.

31 Claims, 4 Drawing Sheets

ELECTROMAGNETIC INTERFERENCE (EMI) ABSORBING ASSEMBLY AND METHOD FOR USE IN AN OPTICAL TRANSCEIVER MODULE

TECHNICAL FIELD OF THE INVENTION

The invention relates to optical transceiver modules. More particularly, the invention relates to an electromagnetic interference (EMI) absorbing assembly for use in an optical transceiver module for providing EMI sealing within the housing of the transceiver module.

BACKGROUND OF THE INVENTION

In optical communications networks, optical transceiver modules are used to transmit and receive optical signals over optical fibers. On the transmit side of a transceiver module, a light source (e.g., a laser diode) generates amplitude modulated optical signals that represent data, which are received by an optics system of the transceiver module and focused by the optics system into an end of a transmit optical fiber. The signals are then transmitted over the transmit fiber to a receiver node of the network. On the receive side of the transceiver module, the optics system of the transceiver module receives optical signals output from an end of a receive optical fiber and focuses the optical signals onto an optical detector (e.g., a photodiode), which converts the optical energy into electrical energy.

The transmit and receive fiber cables have connectors on their ends, often LC connectors, that are adapted to mate with transmit and receive receptacles, respectively, formed in the transceiver module. A variety of optical transceiver module configurations are used in optical communications network. Some optical transceiver modules have multiple transmit receptacles and multiple receive receptacles for connecting multiple receive and transmit fiber cables to the module. Some transceiver modules having a single receive receptacle and a single transmit receptacle arranged side by side for connecting a single receive fiber cable and a single transmit fiber cable, respectively, to the transceiver module.

The transceiver modules themselves typically also have mating elements on them that are adapted to mate with mating elements formed on the cages into which the modules are inserted. The cages are typically contained in racks, and each rack typically includes many cages that are arranged in very close proximity to one another. Each of these cages is configured to receive a transceiver module on the front side of the rack through a front panel of the rack. The transceiver modules are configured so that they may be inserted into and removed from the cages. The modules typically include latching mechanisms that couple to mating features on the cages when the modules are inserted into the cages. In order to remove a module from a cage, the module must be de-latched to decouple the latching mechanism from the features on the cage, which can be challenging when the modules are spaced closely together in the racks.

Most optical transceiver modules include one or more electromagnetic interference (EMI) sealing components that are designed to prevent electromagnetic radiation from escaping from the transceiver modules. The Federal Communications Commission provides standards that limit the amount of electromagnetic radiation that may emanate from unintended sources. A variety of techniques and designs are used to shield potential EMI openings in optical transceiver modules in order to limit the amount of EMI radiation that may pass through the openings and thereby propagate into the environment outside of the modules. One area in transceiver modules that constitutes a large EMI opening is the backside of the transceiver module opposite the printed circuit board (PCB). The PCB typically contains electrical components that are EMI sources, such as the laser diode driver integrated circuit (IC), which drives the laser diode of the transmit side of the transceiver module. Often times, an EMI absorbing assembly comprising a sheet of EMI absorbing material, such as a sheet of Eccosorb® material or the like, is placed in the transceiver module housing in a cavity between the backside of the module housing and the laser diode driver IC to prevent EMI generated by the laser diode driver IC from passing through the backside of the module housing. Eccosorb® material is an electromagnetic radiation absorbing material manufactured by a company called Emerson & Cuming Microwave Products, Inc. One of the problems associated with using a sheet of absorbing material disposed in free space in the housing is that it absorbs the magnetic, but not the electrical, components of the EMI. Therefore, the absorbing assembly is not a completely effective EMI sealing solution when employed in this manner.

Another problem associated with using an EMI absorption assembly comprising a sheet of radiation absorbing material disposed in free space in the housing is that such a solution does not prevent resonant modes of the fundamental frequency of the laser diode driver IC from occurring in the module housing. The length of the cavity in the module housing in which the sheet of material is placed often has a length that can allow resonant frequencies of the fundamental frequency to occur in the housing. These resonant EMI modes also need to be sealed within the housing in order to be compliant with EMI sealing requirements.

Accordingly, a need exists for an EMI absorbing assembly that is effective at shielding EMI in an optical transceiver module. A need also exists for an EMI absorbing assembly that prevents or lessens the occurrence of resonant frequency modes in the transceiver module that also must be dealt with by the EMI sealing solution used in the module.

SUMMARY OF THE INVENTION

An electromagnetic interference (EMI) absorbing assembly and method are provided for use in an optical transceiver module. The assembly comprises an electrically conductive leadframe, and an EMI absorbing material secured to the leadframe. The leadframe has one or more components that are shaped and sized to make contact with one or more respective portions of a housing of the optical transceiver module if the EMI absorbing assembly is installed in the housing.

The method comprises providing an optical transceiver module in which an EMI absorbing assembly is to be installed, installing an EMI absorbing assembly in a housing of the optical transceiver module, and placing one or more areas on a leadframe of the EMI absorbing assembly in contact with one or more electrically conductive areas of the housing of the transceiver module to electrically ground the leadframe to the housing of the transceiver module. The leadframe of the EMI absorbing assembly is electrically conductive and has an EMI absorbing material secured thereto.

These and other features and advantages of the invention will become apparent from the following description, drawings and claims.

DETAILED DESCRIPTION OF AN ILLUSTRATIVE EMBODIMENT

In accordance with various embodiments that will be described herein, an optical transceiver module is provided that has an EMI absorbing assembly that comprises an EMI absorbing device that is electrically grounded rather than standing in free space in the transceiver module so that the assembly absorbs both the magnetic and electrical components of the EMI. In accordance with an embodiment, the EMI absorbing assembly includes a leadframe about which an EMI absorbing material is cast. The leadframe preferably is shaped in a way that prevents or lessens the occurrence of resonant EMI modes in the transceiver module housing.

Figure 1:
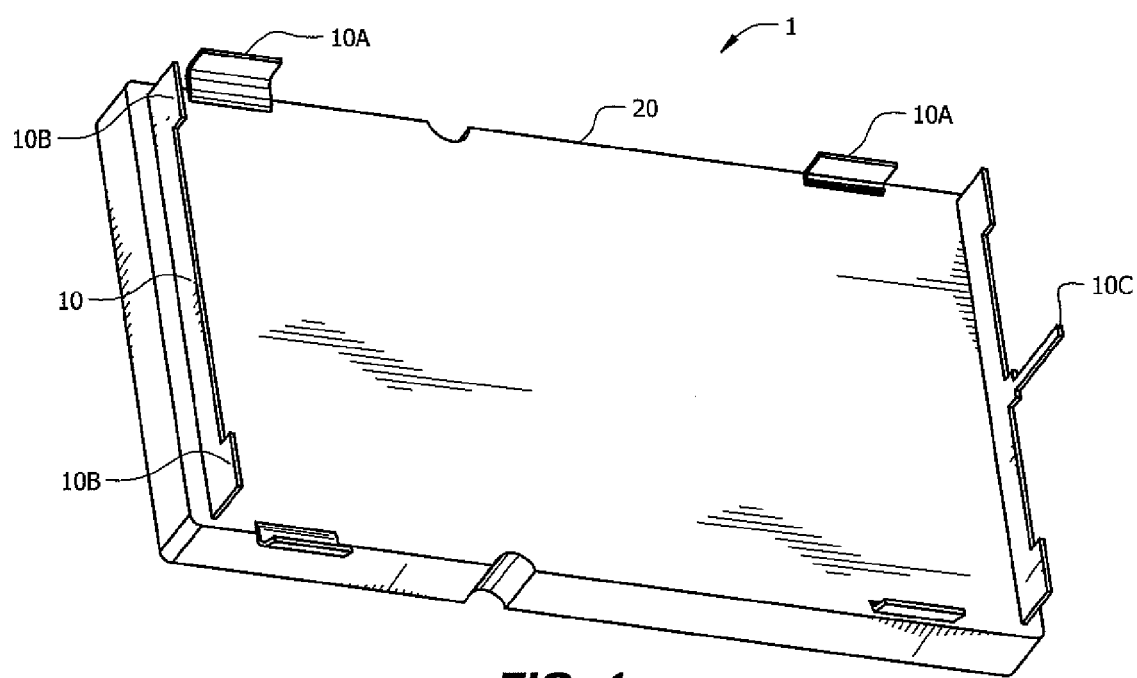
FIG. 1 illustrates a bottom perspective view of the EMI absorbing assembly in accordance with an illustrative embodiment.

FIG. 1 illustrates a bottom perspective view of the EMI absorbing assembly 1 in accordance with an illustrative embodiment. The assembly 1 comprises a leadframe 10 made of an electrically conductive material, such as metal, and an EMI absorbing material 20 that is secured to the leadframe 10 during a casting process. The EMI absorbing material may be the aforementioned Eccosorb® material manufactured by Emerson & Cuming Microwave Products, Inc. This material is offered in various forms, including flexible foams and elastomers, as well as rigid polymers. Preferably, the form of the absorbing material 20 used with the invention is a rigid polymer that is secured to the leadframe 10 during a casting process during which a liquid polymer and the leadframe 10 are placed in a mold (not shown) and the liquid polymer is then cured to harden it and secure it to the leadframe 10. However, the invention is not limited to using a particular type of absorbing material for this purpose. Eccosorb® material is merely an example of one material that is suitable for use in the EMI absorbing assembly 1 for performing this function.

As will be described below in detail, the leadframe 10 preferably has a shape and design that prevents or lessens the occurrence of EMI resonant modes in the transceiver module housing (not shown), which is typically made of metal. The leadframe 10 acts as an electrical ground plane when the assembly 1 is disposed within the transceiver module housing. The leadframe 10 has ears 10A on it that are compliant and spring outwards against the transceiver module housing when the leadframe 10 is installed in the housing, thereby making electrical ground connections between the leadframe 10 and the metallic housing. The leadframe 10 includes frame portions 10B that are in contact with the PCB of the transceiver module housing when the assembly 1 is disposed within the module housing. The leadframe 10 includes a pin 10C that passes through the PCB of the transceiver module when the assembly 1 is installed in the housing and makes electrical contact with the front side of the transceiver module housing, thereby electrically grounding the leadframe 10 to the front side of the transceiver module housing. The electrical grounding of the leadframe 10 to the transceiver module housing ensures that the EMI absorbing assembly 1 will absorb both the magnetic and electrical EMI components.

Figure 2:
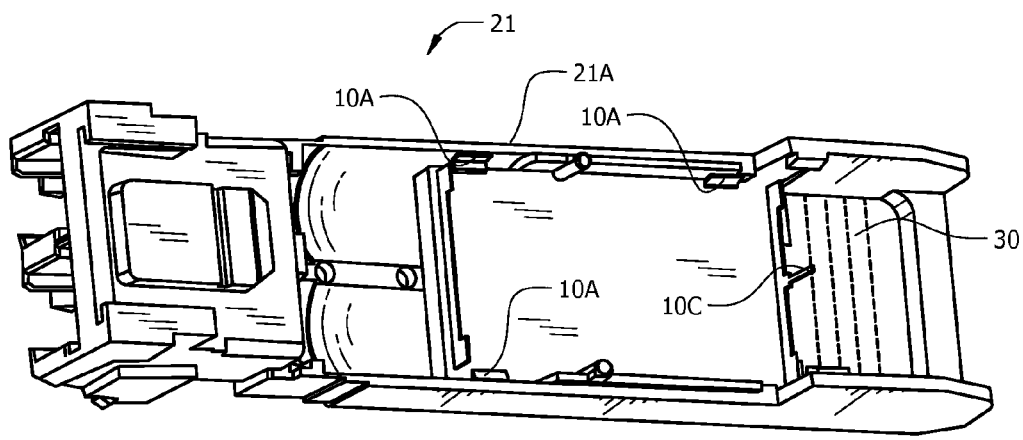
FIG. 2 illustrates a bottom side perspective view of the EMI absorbing assembly shown in FIG. 1 when disposed inside of an optical transceiver module housing.

FIG. 2 illustrates a bottom side perspective view of the EMI absorbing assembly 1 shown in FIG. 1 when disposed inside of an optical transceiver module housing 21. Only the backside portion 21A of the housing 21 is shown in FIG. 2. The invention is not limited with respect to the type or configuration of the transceiver module housing with which the EMI absorbing assembly is used. The transceiver module housing 21 shown in FIG. 2 is merely one example of a transceiver module housing with which the assembly 1 may be used. The manner in which the ears 10A of the EMI absorbing assembly 1 spring outwards against the housing 21 to make electrical contact between the lead frame 10 and the housing 21 can be easily seen in FIG. 2. Another important feature of the invention is the location of the pin 10C. The pin 10C is positioned halfway across the width, W, of the assembly 1. As described above, when the assembly 1 is disposed in the housing 21, the pin 10C passes through the PCB (not shown) and makes contact with the top side (not shown) of the transceiver module housing 21. This location of the pin 10C essentially halves the size of the EMI aperture that would otherwise exist in the housing 21 at the location where the assembly 1 is installed. Reducing the size of the EMI aperture in this manner greatly improves the effectiveness of the EMI absorbing assembly 1.

In addition, as will be described below in more detail with reference to FIG. 3, preferably an additional EMI absorbing device 30 is disposed between the EMI absorbing assembly 1 and the backside portion 21A of the housing 21. Preferably, this EMI absorbing device 30 is cast on the backside portion 21A of the housing 21. The EMI absorbing device 30 may be the same Eccosorb® material that is cast about the leadframe 10 of the assembly 1. This additional EMI absorbing device 30 serves to further improve EMI shielding in the transceiver module housing 21.

Figure 3:
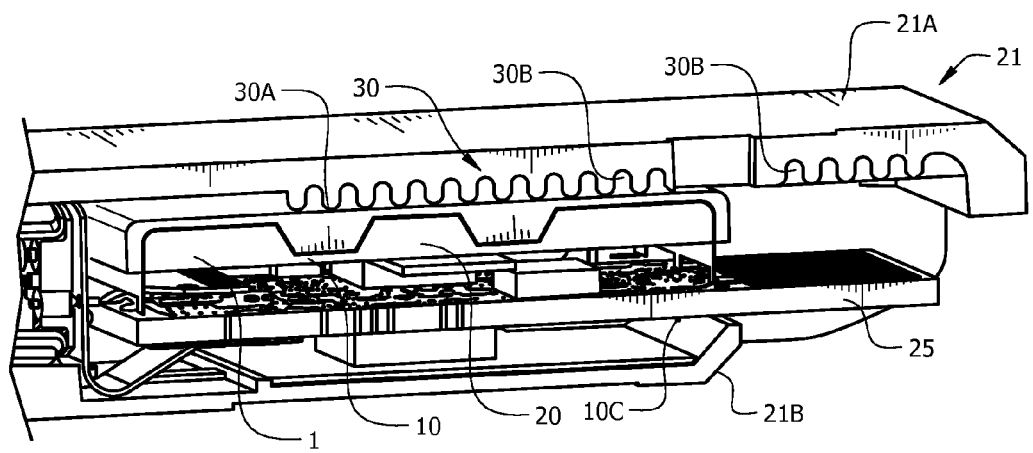
FIG. 3 illustrates a side perspective view of a cross section of transceiver module housing, which shows the EMI absorbing assembly shown in FIG. 1 when disposed inside of an optical transceiver module housing.

FIG. 3 illustrates a side perspective view of a cross section of transceiver module housing 21, which shows the EMI absorbing assembly 1 shown in FIG. 1 when disposed inside of an optical transceiver module housing 21. The backside portion 21A of the housing 21 has a wavy, or corrugated, surface area 30A formed on it on which the EMI absorbing material 30B is cast. The wavy nature of the surface 30A increases the amount of surface on which the EMI absorbing material 30B is carried over that which would exist if the surface were flat. Increasing the surface area on which the absorbing material 30B is carried further improves EMI shielding in the transceiver module housing 21. The contact between the pin 10C and between the portions 10B of the leadframe 10 and a PCB 25 of the transceiver module are visible in FIG. 3. Also visible in FIG. 3 is the preferred non-planar shape of the leadframe 10. The nonplanar shape of the leadframe 10 serves to prevent resonant EMI modes from occurring in the housing 21 and creates more surface area for placement of the EMI absorbing material 20 for absorbing EMI.

Figure 4:
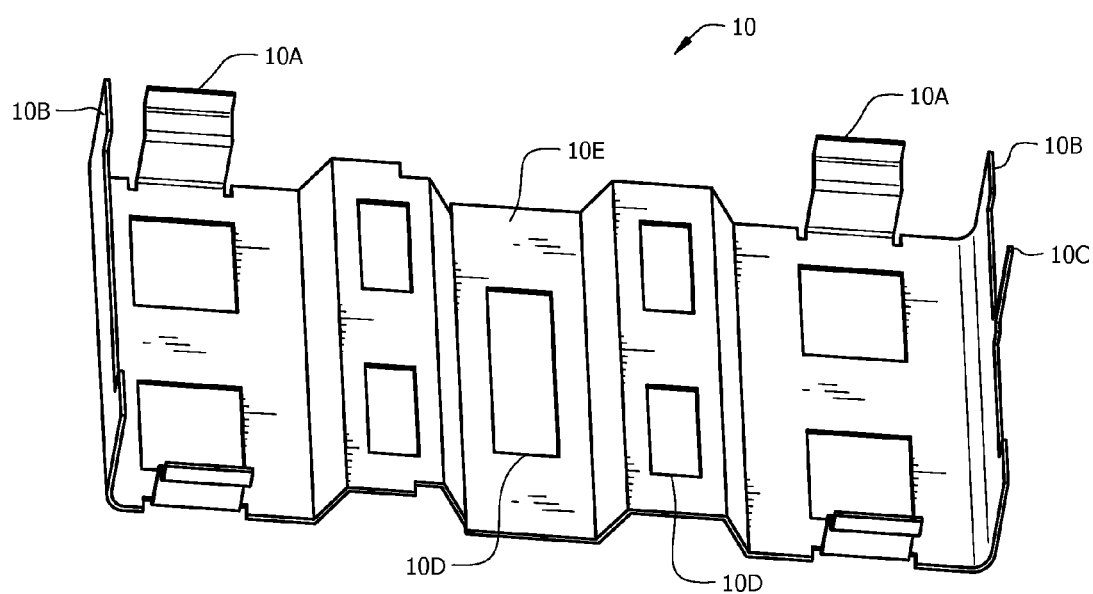
FIG. 4 illustrates a bottom perspective view of the leadframe of the EMI absorbing assembly shown in FIG. 1 before the EMI absorbing material of the assembly shown in FIG. 1 has been attached to the leadframe.

FIG. 4 illustrates a bottom perspective view of the frame 10 of the EMI absorbing assembly 1 shown in FIG. 1 without the EMI absorbing material 20 shown in FIG. 1 secured to the leadframe 10. The leadframe 10 preferably has a base portion 10E that is non-planar in shape, as shown in FIG. 4. The leadframe 10 acts as an electrical ground plane when the assembly 1 is disposed within the transceiver module housing 21 (FIG. 3). As indicated above with reference to FIG. 3, the non-planar shape of the leadframe 10 serves to prevent resonant EMI modes from occurring in the housing 21. In addition, the non-planar shape of the base portion 10E creates more surface area on which the EMI absorbing material 20 can be carried, which results in even greater EMI absorption. The leadframe 10 preferably has openings 10D formed in it. The openings 10D are filled with the EMI absorbing material 20 (FIG. 1) during the casting process. EMI passes into the openings 10D and is absorbed by the EMI absorbing material 20 disposed within and around the openings 10D. The openings 10D having the EMI absorbing material 20 therein act as EMI absorbers in free space to absorb the magnetic EMI components. The electrical grounding of the leadframe 10 ensures that the electrical EMI components are also absorbed by the EMI absorbing assembly 1.

As stated above with reference to FIG. 1, the EMI absorbing material 20 is attached to the leadframe 10 during a casting process. During the casting process, the leadframe 10 is placed in a mold (not shown) and the absorbing material 20 is placed in the mold in contact with the leadframe 10. The EMI absorbing material is then hardened to secure it to the leadframe 10. The resulting EMI absorbing assembly 1 then has the shape and composition shown in FIG. 1. However, it will be understood by persons of ordinary skill in the art in view of the description provided herein that EMI absorption assemblies having different shapes and compositions are also suitable for use with the invention.

Figure 5:
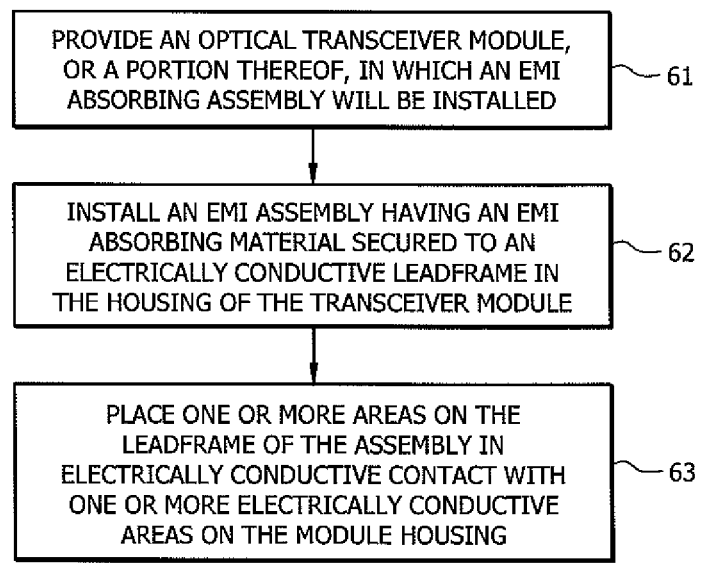
FIG. 5 illustrates a flowchart that represents the method for absorbing EMI in an optical transceiver module in accordance with an illustrative embodiment.

FIG. 5 illustrates a flowchart that represents the method for absorbing EMI in an optical transceiver module. An optical transceiver module, or a portion thereof (e.g., housing portion 21A in FIG. 2), is provided, as indicated by block 61. An EMI absorbing assembly comprising an EMI absorbing material secured to an electrically conductive leadframe is installed in the housing of the optical transceiver module, as indicated by block 62. One or more areas on the electrically conductive leadframe are then placed in electrical contact with one or more electrically conductive areas on the housing to electrically ground the leadframe to the housing, as indicated by block 63.

Variations or additions to the method represented by the flowchart shown in FIG. 5 include, but are not limited to, for example, providing a surface of the transceiver module housing with a wavy or corrugated surface area 30A (FIG. 3), disposing an EMI absorbing material 30B on the surface area (FIGS. 2 and 3), providing the leadframe with a non-planar shape (FIGS. 3 and 4), providing the leadframe with a pin that contacts the module housing and effectively halves the EMI aperture (FIGS. 1-4), etc.

It should be noted that the invention has been described with reference to a few illustrative embodiments for the purposes of demonstrating the principles and concepts of the invention and the manner in which they may be implemented. The invention is not limited to these embodiments, but rather, a variety of modifications may be made to these embodiments without deviating from the scope of the invention. For example, although the EMI absorbing assembly has been described as having a particular shape and design, other shapes and designs may be used that enable the goals of the invention to be achieved. Also, although the embodiments have been described with reference to a particular optical transceiver module, the invention applies equally to other transceiver module types and designs, as well as to optical receiver modules that do not include transmit functionality and optical transmitter modules that do not include receive functionality. Thus, the term "transceiver module", as that term is used herein, is intended to denote a module that includes a transmitter and receiver, a module that includes a receiver only, and a module that includes a transmitter only. Those skilled in the art will understand the manner in which modifications may be made to the embodiments described herein and that all such modifications are within the scope of the invention.

What is claimed is:

1. An electromagnetic interference (EMI) absorbing assembly for use with an optical transceiver module, the assembly comprising:
    an electrically conductive leadframe, the leadframe having one or more components that are shaped and sized to make contact with one or more respective portions of a metal housing of the optical transceiver module if the EMI absorbing assembly is installed in the metal housing; and
    an EMI absorbing material secured to the leadframe.

2. The EMI absorbing assembly of claim 1, wherein the EMI absorbing assembly is a cast assembly formed by casting the EMI absorbing material on the electrically conductive leadframe.

3. The EMI absorbing assembly of claim 1, wherein at least one of the one or more components of the leadframe includes an electrically conductive pin that is configured to pass through a printed circuit board of the optical transceiver module and make electrically conductive contact with a portion of the module housing if the EMI absorbing assembly is installed in the housing.

4. The EMI absorbing assembly of claim 1, wherein at least one of the one or more components of the leadframe includes an electrically conductive ear having spring characteristics such that if the EMI absorbing assembly is installed in the housing, the ear springs outward against an inside surface of the module housing thereby making electrically conductive contact with the housing.

5. The EMI absorbing assembly of claim 1, wherein the leadframe has a base portion that is non-planar in shape.

6. The EMI absorbing assembly of claim 5, wherein the base portion of the leadframe has one or more openings formed therein, and wherein the EMI absorbing material secured to the leadframe surrounds at least the base portion of the leadframe and extends through the openings formed in the base portion of the leadframe.

7. The EMI absorbing assembly of claim 5, wherein the non-planar shape of the base portion is configured to prevent or lessen an occurrence of resonant EMI modes in the transceiver module housing.

8. An optical transceiver module having an electromagnetic interference (EMI) system therein, the EMI system comprising:
    an EMI absorbing assembly disposed within a housing of the optical transceiver module, the EMI absorbing assembly comprising:
        an electrically conductive leadframe, the leadframe having one or more components that are shaped and sized to make contact with one or more respective portions of the optical transceiver module housing such that the EMI absorbing assembly is electrically grounded to the housing; and
        an EMI absorbing material secured to the leadframe; and
    an EMI absorbing device formed on at least one surface of the transceiver module housing, the EMI absorbing device comprising:
        a wavy or corrugated surface area formed on said at least one surface of the transceiver module housing; and
        an EMI absorbing material on the wavy or corrugated surface area of the housing.

9. The optical transceiver module of claim 8, wherein the EMI absorbing device formed on said at least one surface of the transceiver module housing is in contact with the EMI absorbing assembly disposed within the transceiver module housing.

10. The optical transceiver module of claim 8, wherein the EMI absorbing assembly is a cast assembly formed by casting the EMI absorbing material on the electrically conductive leadframe.

11. The optical transceiver module of claim 8, wherein at least one of the one or more components of the leadframe includes an electrically conductive pin that is configured to pass through a printed circuit board of the optical transceiver module and make electrically conductive contact with a portion of the module housing if the EMI absorbing assembly is installed in the housing.

12. The optical transceiver module of claim 8, wherein at least one of the one or more components of the leadframe includes an electrically conductive ear having spring characteristics such that if the EMI absorbing assembly is installed in the housing, the ear springs outward against an inside surface of the module housing thereby making electrically conductive contact with the housing.

13. The optical transceiver module of claim 8, wherein the leadframe has a base portion that is non-planar in shape.

14. The optical transceiver module of claim 13, wherein the base portion of the leadframe has one or more openings formed therein, and wherein the EMI absorbing material secured to the leadframe surrounds at least the base portion of the leadframe and extends through the openings formed in the base portion of the leadframe.

15. The optical transceiver module of claim 13, wherein the non-planar shape of the base portion is configured to prevent or lessen an occurrence of resonant EMI modes in the transceiver module housing.

16. A method for absorbing electromagnetic interference (EMI) in an optical transceiver module, the method comprising:
providing an optical transceiver module in which an EMI absorbing assembly is to be installed;
install an EMI absorbing assembly in a housing of the optical transceiver module, the EMI absorbing assembly including an electrically conductive leadframe having an EMI absorbing material secured thereto; and
placing one or more areas on the leadframe in contact with one or more electrically conductive areas of the housing to electrically ground the leadframe to the housing of the transceiver module.

17. The method of claim 16, wherein the EMI absorbing assembly is a cast assembly formed by casting the EMI absorbing material on the electrically conductive leadframe.

18. The method of claim 16, wherein the leadframe includes one or more electrically conductive components that are shaped and sized to make contact with one or more areas of the housing of the optical transceiver module when the EMI absorbing assembly is installed in the housing.

19. The method of claim 18, wherein said placing one or more areas on the leadframe in contact with one or more electrically conductive areas of the housing occurs when the EMI absorbing assembly is installed in the housing and said one or more electrically conductive components make contact with said one or more areas of the housing of the optical transceiver module.

20. The method of claim 18, wherein at least one of said one or more components of the leadframe includes an electrically conductive pin that passes through a printed circuit board of the optical transceiver module and makes electrically conductive contact with a portion of the module housing when the EMI absorbing assembly is installed in the housing.

21. The method of claim 19, wherein at least one of the one or more components of the leadframe includes an electrically conductive ear having spring characteristics such that when the EMI absorbing assembly is installed in the housing, the ear springs outward against an inside surface of the module housing thereby making electrically conductive contact with the housing.

22. The method of claim 16, wherein the leadframe has a base portion that is non-planar in shape.

23. The method of claim 22, wherein the base portion of the leadframe has one or more openings formed therein, and wherein the EMI absorbing material secured to the leadframe surrounds at least the base portion of the leadframe and extends through the openings formed in the base portion of the leadframe.

24. The method of claim 22, wherein the non-planar shape of the base portion is configured to prevent or lessen an occurrence of resonant EMI modes in the transceiver module housing.

25. An electromagnetic interference (EMI) absorbing assembly for use with an optical transceiver module, the assembly comprising:
an electrically conductive leadframe, the leadframe having one or more components that are shaped and sized to make contact with one or more respective portions of a housing of the optical transceiver module if the EMI absorbing assembly is installed in the housing, wherein at least one of the one or more components of the leadframe includes an electrically conductive ear having spring characteristics such that if the EMI absorbing assembly is installed in the housing, the ear springs outward against an inside surface of the module housing thereby making electrically conductive contact with the housing; and
an EMI absorbing material secured to the leadframe.

26. The EMI absorbing assembly of claim 25, wherein the EMI absorbing assembly is a cast assembly formed by casting the EMI absorbing material on the electrically conductive leadframe.

27. The EMI absorbing assembly of claim 25, wherein at least one of the one or more components of the leadframe includes an electrically conductive pin that is configured to pass through a printed circuit board of the optical transceiver module and make electrically conductive contact with a portion of the module housing if the EMI absorbing assembly is installed in the housing.

28. An electromagnetic interference (EMI) absorbing assembly for use with an optical transceiver module, the assembly comprising:
an electrically conductive leadframe, the leadframe having one or more components that are shaped and sized to make contact with one or more respective portions of a housing of the optical transceiver module if the EMI absorbing assembly is installed in the housing, wherein the leadframe has a base portion that is non-planar in shape and that has one or more openings formed therein; and
an EMI absorbing material secured to the leadframe, and wherein the EMI absorbing material surrounds at least the base portion of the leadframe and extends through the openings formed in the base portion of the leadframe.

29. The EMI absorbing assembly of claim 28, wherein the EMI absorbing assembly is a cast assembly formed by casting the EMI absorbing material on the electrically conductive leadframe.

30. The EMI absorbing assembly of claim 28, wherein at least one of the one or more components of the leadframe includes an electrically conductive pin that is configured to pass through a printed circuit board of the optical transceiver module and make electrically conductive contact with a portion of the module housing if the EMI absorbing assembly is installed in the housing.

31. The EMI absorbing assembly of claim 28, wherein the non-planar shape of the base portion is configured to prevent or lessen an occurrence of resonant EMI modes in the transceiver module housing.

* * * * *